United States Patent
Kawamura et al.

(10) Patent No.: US 10,074,415 B2
(45) Date of Patent: *Sep. 11, 2018

(54) BOOSTING A DIGIT LINE VOLTAGE FOR A WRITE OPERATION

(71) Applicant: Micron Technology, Inc., Boise, ID (US)

(72) Inventors: Christopher Kawamura, Boise, ID (US); Howard Kirsch, Eagle, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/645,128

(22) Filed: Jul. 10, 2017

(65) Prior Publication Data

US 2017/0358340 A1 Dec. 14, 2017

Related U.S. Application Data

(63) Continuation of application No. 15/151,065, filed on May 10, 2016, now Pat. No. 9,721,638.

(51) Int. Cl.
*G11C 11/22* (2006.01)

(52) U.S. Cl.
CPC ........ *G11C 11/2275* (2013.01); *G11C 11/221* (2013.01); *G11C 11/2273* (2013.01)

(58) Field of Classification Search
CPC .............. G11C 11/2275; G11C 11/221; G11C 11/2273
See application file for complete search history.

(56) References Cited

U.S. PATENT DOCUMENTS

| | | | |
|---|---|---|---|
| 5,270,967 A | 12/1993 | Moazzami et al. | |
| 5,572,459 A | 11/1996 | Wilson et al. | |
| 6,198,651 B1 | 3/2001 | Lee et al. | |
| 6,600,679 B2 * | 7/2003 | Tanzawa | G11C 5/145 365/189.11 |
| 6,999,335 B2 | 2/2006 | Murakuki | |
| 7,768,811 B2 | 8/2010 | Matsuno et al. | |
| 8,014,186 B2 | 9/2011 | Kimura et al. | |
| 9,721,638 B1 * | 8/2017 | Kawamura | G11C 11/2275 |
| 9,786,347 B1 * | 10/2017 | Kawamura | G11C 11/2273 |

OTHER PUBLICATIONS

Eliason et al., "An 8mb 1T1C Ferroelectric Memory With Zero Cancellation and Micro-Granularity Redundancy," Custom Integrated Circuits Conference, Proceedings of the IEEE, Sep. 21, 2005, pp. 427-430, IEEE.

* cited by examiner

*Primary Examiner* — Pho M Luu
(74) *Attorney, Agent, or Firm* — Holland and Hart LLP

(57) ABSTRACT

Methods, systems, and devices for operating a ferroelectric memory cell or cells are described. The magnitude of a voltage applied across a ferroelectric capacitor may be dynamically increased during a write operation. For example, a memory cell may be selected for a write operation, and a voltage may be applied to a digit line corresponding to the memory cell during the write operation. An additional charge may be transferred to the digit line—e.g., from an energy storage component, such as a capacitor, that is in electronic communication with the digit line. In turn, the voltage across the ferroelectric capacitor of the memory cell may be increased.

20 Claims, 8 Drawing Sheets

BOOSTING A DIGIT LINE VOLTAGE FOR A WRITE OPERATION

CROSS REFERENCE

The present Application for Patent is a continuation of U.S. patent application Ser. No. 15/151,065 by Kawamura et al., entitled "Boosting a Digit Line Voltage for a Write Operation," filed May 10, 2016, now U.S. Pat. No. 9,721,638, issued Aug. 1, 2017, assigned to the assignee hereof, and expressly incorporated by reference in its entirety herein.

BACKGROUND

The following relates generally to memory devices and more specifically to boosting a voltage of a digit line during a write operation to a ferroelectric memory cell.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory (e.g., flash memory) can store data for extended periods of time even in the absence of an external power source. Volatile memory devices (e.g., DRAM) may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

In some architectures, to write a logic state to an FeRAM memory cell, a positive voltage or a negative voltage is applied across a ferroelectric capacitor of the FeRAM memory cell. Once the voltage is removed, the ferroelectric capacitor may remain polarized—e.g., it may retain one of two charge states corresponding to a logic state "0" or a logic state "1"—based on the voltage applied across the ferroelectric capacitor. In some cases, the amount of charge stored by ferroelectric capacitor for a particular logic state is dependent on the magnitude of the voltage applied across the ferroelectric capacitor, and variations in stored charge may affect the accuracy of a subsequent read operation.

BRIEF DESCRIPTION OF THE DRAWINGS

The disclosure herein refers to and includes the following figures.

DETAILED DESCRIPTION

The magnitude of a voltage applied across a ferroelectric capacitor of a ferroelectric memory cell may be increased (or "boosted") during a write operation to increase the total amount of charge stored by the ferroelectric capacitor. For example, a memory cell that includes a ferroelectric capacitor may be selected for a write operation, and a voltage may be applied to a digit line corresponding to the memory cell during the write operation in order to write a logic state. The digit line may be subsequently isolated, and an additional amount of charge may be transferred to the digit line. This additional charge transfer may increase the voltage of the digit line, which, in turn, may increase the voltage across the ferroelectric capacitor.

In some cases, an energy storage component may transfer charge to the digit line while the digit line is isolated, which may boost the voltage of the digit line. For instance, a capacitor may be in electronic communication with the digit line via a switching component and may release charge to the digit line after the switching component is activated. In some cases, a voltage may be applied to the capacitor, triggering the capacitor to release charge on to the digit line. In this way, a larger sensing window—e.g., the difference between a voltage resulting on the digit line from a first and second logic state—may be increased during a subsequent read operation.

Features of the disclosure introduced above are further described below in the context of a memory array. Specific examples are then described for an example circuit and corresponding timing diagram for boosting a digit line voltage during a write operation. These and other features of the disclosure are further illustrated by and described with reference to apparatus diagrams, system diagrams, and flowcharts that relate to boosting a digit line voltage during a write operation.

Figure 1:
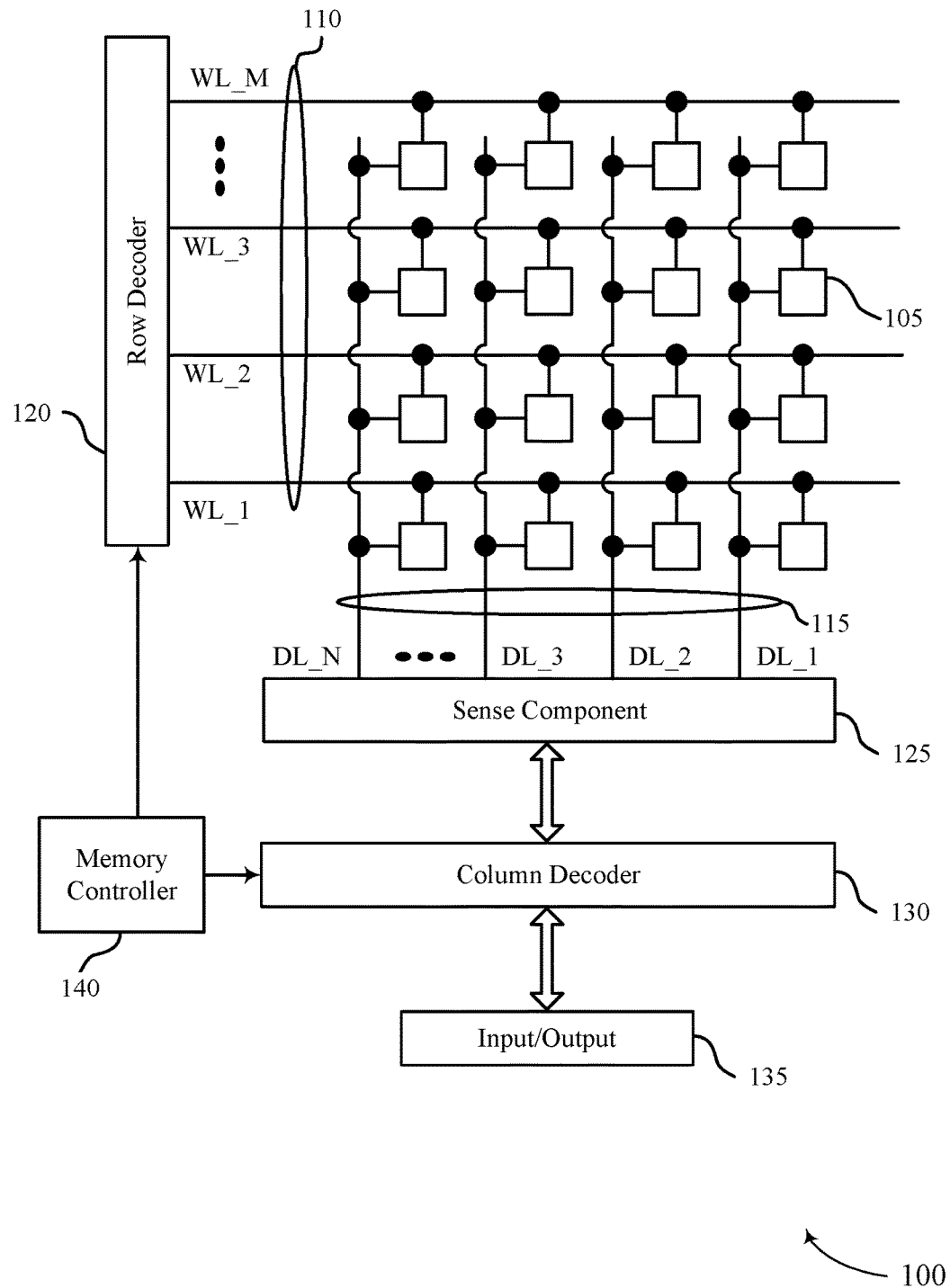
FIG. 1 illustrates an example memory array that supports a write operation with a boosted digit line voltage in accordance with various embodiments of the present disclosure.

FIG. 1 illustrates an example memory array 100 that supports a write operation with a boosted digit line voltage in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic "0" and a logic "1." In some cases, memory cell 105 is configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting the appropriate access line, which may also be referred to as a word line 110 or a digit line 115. Activating or selecting a word line 110 or a digit line 115 may include applying a voltage to the respective line. In some cases, a digit line 115 may be referred to as a bit line. Word lines 110 and digit lines 115 are made of conductive materials. For example, word lines 110 and digit lines 115 may be made of metals (e.g., copper, aluminum, gold, tungsten, etc.), metal alloys, other conductive materials, or the like. According to the example of FIG. 1, each row of memory cells 105 are connected to a word line 110, and each column of memory cells 105 are connected to digit line 115. By activating (e.g., applying a voltage to the word line 110 or digit line 115), a single memory cell 105 may be accessed at their intersection. The intersection of a word line 110 and digit line 115 may be referred to as an address of a memory cell.

In some architectures, the logic-storing device of a cell (e.g., a capacitor) may be electrically isolated from the digit line by a selection component. The word line 110 may be connected to and may control the selection component. For example, the selection component may be a transistor and the word line 110 may be connected to the gate of the transistor. Activating the word line 110 may thus result in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 may receive a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic "1" and vice versa. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the word line 110 and digit line 115 associated with the cell 105. As discussed above, activating a word line 110 electrically connects the corresponding row of memory cells 105 to their respective digit lines 115. By controlling the digit line 115 of a memory cell 105 while the word line 110 of the memory cell 105 is activated, the memory cell 105 may be written—i.e., a logic value may be stored in the memory cell 105. Column decoder 130 may accept data, for example input 135, to be written to the memory cells 105.

A ferroelectric memory cell 105 may be written by applying a voltage across the ferroelectric capacitor. For instance, to write a logic "1" in a fixed plate scheme, a voltage of a digit line 115 may be biased at a high supply voltage, while a voltage of a plate line may be maintained at a fixed voltage that is less than the voltage applied to the digit line 115. This may result in a negative voltage across the ferroelectric capacitor. Subsequently, the voltage supply to the ferroelectric capacitor may be removed, and the ferroelectric capacitor may retain (store) a first charge state associated with a logic "1." Alternatively, to write a logic "0," the voltage of the digit line 115 may be biased at a low supply voltage, resulting in a positive voltage being across the ferroelectric capacitor. When the voltage supply is removed, the ferroelectric capacitor may maintain a second charge state associated with a logic "0."

In some examples, writing a logic state to a ferroelectric capacitor is accomplished by biasing the inputs of a sense amplifier that is in electronic communication with a digit line corresponding to the ferroelectric capacitor. For a fixed plate scheme, for example, a logic "0" may be written by applying a voltage to the digit line 115 via the sense component 125 that is greater than the fixed plate voltage, and a logic "1" may be written by applying a voltage to the digit line 115 that is less than the fixed plate voltage. The "strength" of a charge state—e.g., how much charge is retained by the ferroelectric capacitor after writing a logic state—may be dependent upon the magnitude of the voltage applied across the ferroelectric capacitor. For instance, a larger voltage magnitude may be associated with additional charge being stored by the ferroelectric capacitor. By storing a larger charge, a voltage sensed during a read operation may exhibit proportionally larger characteristics; this may be a result of the hysteresis characteristics of the ferroelectric, as described in more detail below and with reference to FIG. 3. That is, the amount of positively retained charge, associated with a logic "0," and the amount of negatively retained charge, associated with a logic "1," may increase.

As discussed above, discharging the ferroelectric capacitor during a read operation may produce in a voltage on a corresponding digit line 115. However, the magnitude of the voltage may be based on the charge state stored by the ferroelectric capacitor. For example, a greater voltage may be developed on the digit line if the charge state of a ferroelectric capacitor is associated with a negative polarization than if the ferroelectric capacitor is positively polarized. This difference in resultant voltages may be referred to as a "sensing window" and may be used to determine which state is stored by the ferroelectric capacitor prior to the read operation—e.g., using the sense component 125 to compare the resulting voltage of the digit line 115 with a reference.

In some cases, boosting the voltage of the digit line 115 during the write operation may increase the magnitude of the charge stored by the ferroelectric capacitor in both logic states, which, in turn, may increase the sensing window. In some examples, an energy storage element (e.g., a capacitor, ferroelectric capacitor, etc.) that is in electronic communication with the digit line 115 and a switching component may be used to boost the voltage of the digit line 115 during the write operation. For example, after the digit line 115 has been biased by a sense component 125, the switching component may be activated, and the energy storage element may be triggered to transfer charge onto the digit line 115.

In some memory architectures, accessing the memory cell 105 may degrade or destroy the stored logic state, and a re-write or refresh operation—also referred to as a writeback operation—may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may also lose their stored state over time unless they are periodically refreshed by an external power source. For example, a charged capacitor may become discharged over time through leakage currents, resulting in the loss of the stored information. The refresh rate of these so-called volatile memory devices may be relatively high—e.g., DRAM may perform tens of refresh operations per second—which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some examples, memory controller 140 may be used to operate memory array 100 to support digit line 115 boosting during a write operation. For instance, memory controller 140 may select a memory cell 105 for a write operation, apply a first voltage to a digit line 115 corresponding to the memory cell, and apply a second voltage to the an additional capacitor that is in electronic communication with the digit line during the write operation, boosting the digit line voltage. In some cases, memory controller 140 may apply the first voltage to the digit line 115 by triggering sense component 125 to bias an associated input to a high or low voltage. Memory controller 140 may also be used to activate a switching component that is in electronic communication with the additional capacitor and the digit line 115 prior to applying the second voltage to the additional capacitor.

Figure 2:
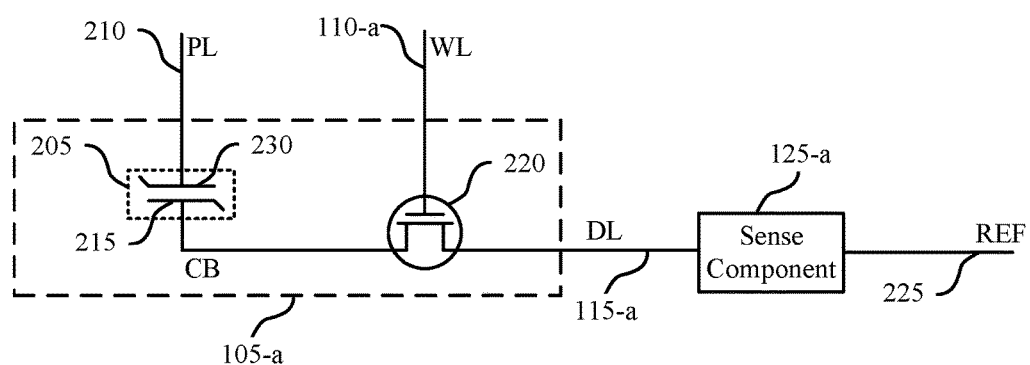
FIG. 2 illustrates an example circuit that includes a memory cell and supports a write operation with a boosted digit line voltage in accordance with various embodiments of the present disclosure.

FIG. 2 illustrates an example circuit 200 of a memory cell that supports a write operation with a boosted digit line voltage in accordance with various embodiments of the present disclosure. Circuit 200 includes a memory cell 105-a, word line 110-a, digit line 115-a, and sense component 125-a, which may be examples of a memory cell 105, word line 110 (which may also be referred to as access line), digit line 115, and sense component 125, respectively, as described with reference to FIG. 1.

Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference signal 225. In the example of FIG. 2, cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor.

Word line 110-a may activate selection component 220; for example, a voltage applied to word line 110-a is applied to the transistor gate, connecting capacitor 205 with digit line 115-a. In an alternative embodiment, the positions of selection component 220 and capacitor 205 may be switched, such that selection component 220 is connected between plate line 210 and cell plate 230 and such that capacitor 205 is between digit line 115-a and the other terminal of selection component 220. Selection component 220 may thus remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. For example, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground prior to biasing plate line 210 and word line 110-a. This may be referred to as "floating." Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic "1" or a logic "0." This may cause a change in the voltage of digit line 115-a based on the charge stored on capacitor 205. Operation of memory cell 105-a by varying the voltage to cell plate 230 may be referred to as a "moving cell plate" operation or architecture.

In an alternative operation of memory cell 105-a, a constant (e.g., "fixed") voltage may be applied to cell plate 230 using plate line 210—e.g., the fixed voltage may be half of the voltage supplied to sense component 125-a. That is, the voltage applied to plate line 210 may remain at a fixed voltage and may not be varied as described above. This type of operation or architecture may be referred to as "fixed cell plate." In order to read ferroelectric memory cell 105-a, digit line 115-a may be virtually grounded and subsequently isolated from virtual ground prior to applying a voltage to word line 110-a. As above, selecting ferroelectric memory cell 105-a may result in a voltage difference across capacitor 205, since plate line 210 is held at a finite voltage and digit line 115-a was virtually grounded. As a result, the voltage of digit line 115-a may change, e.g., become some finite value. In some cases, this resultant voltage may be compared at sense component 125-a with a reference voltage.

The specific sensing scheme or process employed to read memory cell 105-a may take many forms. In one example, digit line 115-a may have an intrinsic capacitance and develop a non-zero voltage as capacitor 205 charges or discharges in response to the voltage applied to plate line 210. The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105, so digit line 115-a may have a length that results in a non-negligible capacitance (e.g., on the order of picofarads (pF) or femtofarads (fF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference signal 225, which may be a reference voltage, during a read operation. The sense amplifier output may be driven to the higher (e.g., a positive) or lower (e.g., negative or ground) supply voltage based on the comparison. For instance, if digit line 115-a has a higher voltage than reference signal 225, then the sense amplifier output may be driven to a positive supply voltage.

In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic "1." Alternatively, if digit line 115-a has a lower voltage than reference signal 225, the sense amplifier output may be driven to a negative or ground voltage. Sense component 125-a may similarly latch the sense amplifier output to determine the stored state in memory cell 105-a, e.g., logic "0." The latched logic state of memory cell 105-a may then be output, for example, through column decoder 130 as output 135 with reference to FIG. 1.

To write memory cell 105-a, a voltage may be applied across capacitor 205. Various methods may be used. For a moving cell plate, selection component 220 may be activated through word line 110-a in order to electrically connect capacitor 205 to digit line 115-a. A voltage may be applied across capacitor 205 by controlling the voltage of cell plate 230 (through plate line 210) and controlling the voltage of cell bottom 215 (through digit line 115-a). To write a logic "0" cell plate 230 may be taken high, that is, a positive voltage may be applied to plate line 210, and cell bottom 215 may be taken low—e.g., by virtually grounding or applying a negative voltage to digit line 115-a. The opposite process is performed to write a logic "1," where cell plate 230 is taken low and cell bottom 215 is taken high—e.g., by triggering the sense component to positively bias the digit line 115-a.

For a fixed cell plate operation or architecture, selection component 220 may be activated and a voltage applied to digit line 115-a may be used to control the voltage of cell bottom 215 for a write operation. In some cases, the fixed voltage magnitude of cell plate 230 may be a value between the supply voltages of sense component 125-a, and sense component 125-a may be used to drive the voltage of digit line 115-a to a voltage equal to the high or the low (e.g., ground or negative) supply voltage. For instance, to write a logic "0", cell bottom 215 may be taken low, that is, the voltage of digit line 115-a may be driven to the low supply voltage. And to write a logic "1", cell bottom 215 may be taken high—e.g., the voltage of digit line 115-a may be driven to the high supply voltage.

In some examples, the voltage of digit line 115-a may be increased (e.g., "boosted") during a write operation to increase a resulting sensing window in a following read operation. For instance, memory cell 105-a may be selected and a voltage may be applied to digit line 115-a (e.g., via sense component) that is less than a fixed voltage applied to plate line 210. Therefore, a positive voltage may be applied across capacitor 205, and capacitor 205 may be positively polarized. To increase the amount of polarization, the magnitude of the voltage of digit line 115-a may be boosted to increase the voltage applied across capacitor 205.

In some examples, boosting the voltage of digit line 115-a, for either fixed or moving cell plate, may include temporarily isolating digit line 115-a from sense component 125-a and transferring additional charge to digit line 115-a. In some cases, an energy storage component that is in electronic communication with digit line 115-a may be triggered to release charge onto digit line 115-a.

Figure 3:
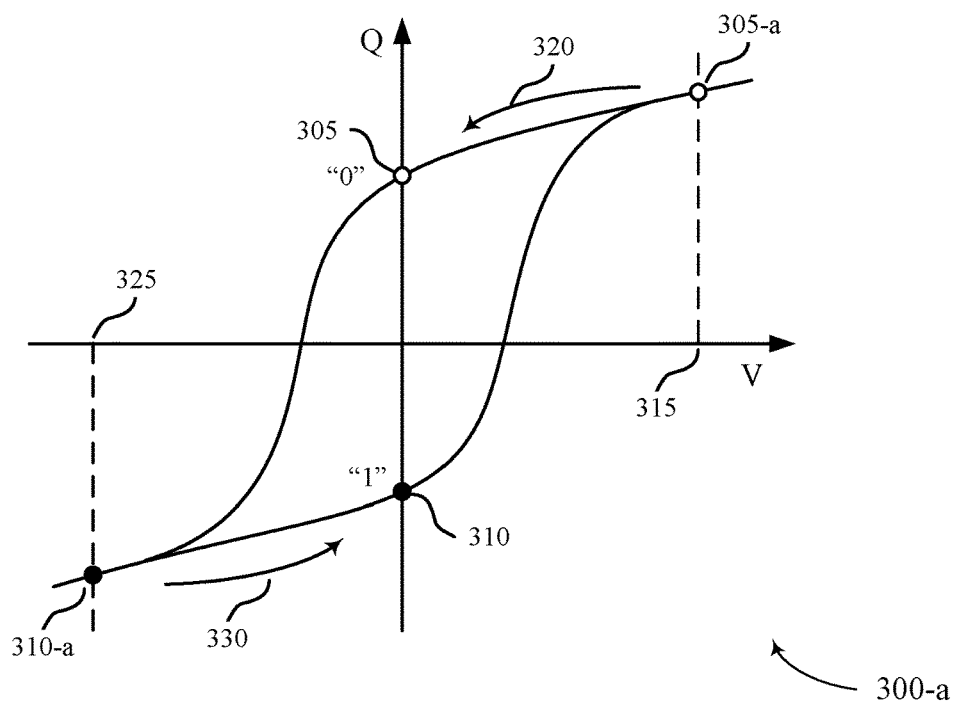
FIG. 3 illustrates example hysteresis plots for a ferroelectric memory cell that supports a write operation with a boosted digit line voltage in accordance with various embodiments of the present disclosure.
Figure 3:
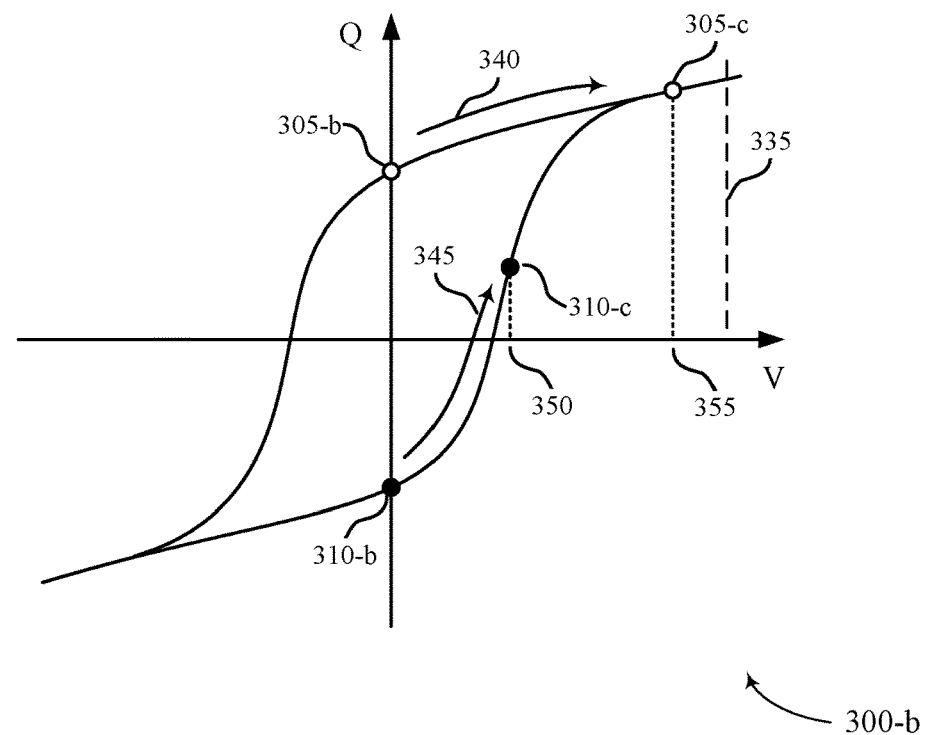

FIG. 3 illustrates examples of such non-linear properties with hysteresis curves 300-a and 300-b for a ferroelectric memory cell that supports a write operation with a boosted digit line voltage in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2) as a function of a voltage, V.

A ferroelectric material is characterized by a spontaneous electric polarization, i.e., it maintains a non-zero electric polarization in the absence of an electric field. Example ferroelectric materials include barium titanate ($BaTiO_3$), lead titanate (PbTiO$_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., cell plate 230) and maintaining the second terminal (e.g., cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic "0" and charge state 310 represents a logic "1." In some examples, the logic values of the respective charge states may be reversed to accommodate other schemes for operating a memory cell.

A logic "0" or "1" may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305 and 310 may also be referred to as the remnant polarization (PR) values, i.e., the polarization (or charge) that remains upon removing the external bias (e.g., voltage). The coercive voltage may be the voltage at which the charge (or polarization) is zero.

The magnitude of the voltage applied across the capacitor (e.g., net positive voltage 315 or net negative voltage 325) may affect the total amount of accumulated charge on the capacitor, which, in turn, may affect the charge state (e.g., charge states 305-a and 305-b) that is reached. For instance, a greater net positive voltage may result in a charge state that is associated with a higher voltage and greater accumulated charge than charge state 305-a. Similarly, a greater net negative voltage may result in a charge state that is associated with a lower voltage and greater accumulated charge in the opposite polarization direction than charge state 310-a. The amount of charge and the magnitude of the voltage associated with a charge state may affect the amount of charge stored at charge states 305 and 310 after removing the voltage from across the capacitor. In some cases, a hysteresis curve that is proportionally larger than hysteresis curve 300-a may be achieved by applying net voltages of greater magnitudes. In some cases, an energy storage element that is in electronic communication with a digit line corresponding to such a capacitor may release charge onto a digit line, boosting the digit line voltage. In turn, the net voltage applied across the capacitor may also be greater.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied to a capacitor cell plate—e.g., cell plate 230 with reference to FIG. 2. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor. Furthermore, as discussed above the resulting charge states 305-c and 310-c may be dependent amount of charge stored by charge states 305-b and 310-b. In some cases, if charge state 305-b and 310-b store greater amounts of charge, the voltage difference between charge states 305-c and 310-c will be greater. Therefore, a corresponding sensing window associated with the voltage difference may also be greater.

By comparing the digit line voltage to a reference voltage, the initial state of the capacitor may be determined. The digit line voltage may be the difference between voltage 335 applied to a plate of the capacitor and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic "0" or "1") may be determined.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

Figure 4:
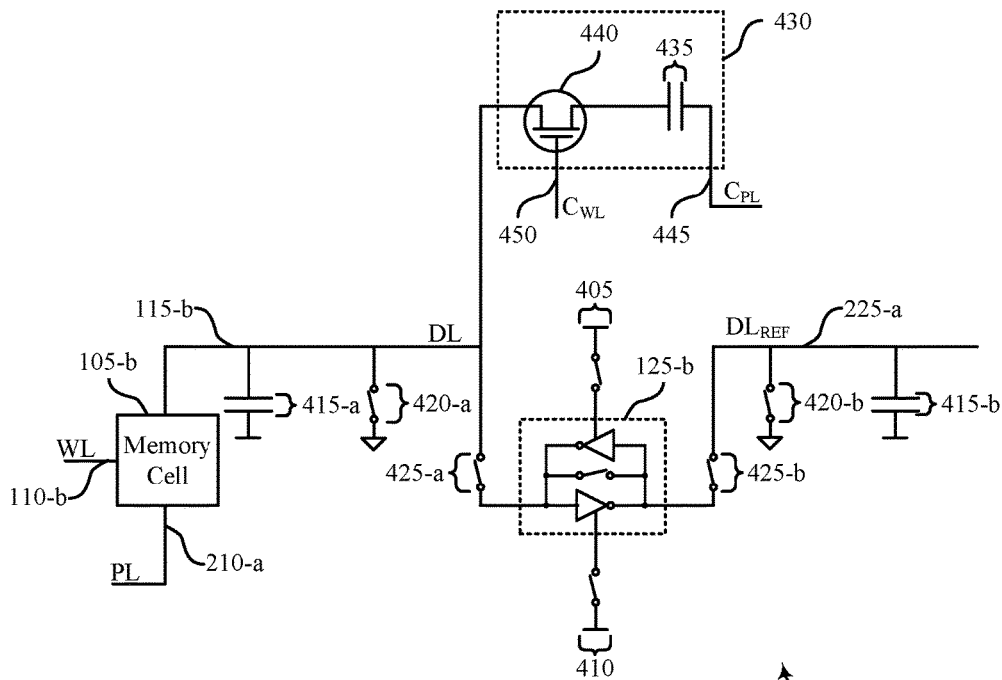
FIG. 4 illustrates an example circuit that supports a write operation with a boosted digit line voltage in accordance with various embodiments of the present disclosure.

FIG. 4 illustrates an example circuit 400 that supports a write operation with a boosted digit line voltage in accordance with various embodiments of the present disclosure. Circuit 400 includes memory cell 105-b, word line 110-b (which may also be referred to as an access line), digit line 115-b, and sense component 125-b, which may be examples of a memory cell 105, word line 110, digit line 115, and sense component 125, respectively, described with reference to FIGS. 1 and 2. Circuit 400 also includes plate line 210-a and reference line 225-a, which may be examples of plate line 210 and reference line 225, respectively, described with reference to FIG. 2. Circuit 400 also includes voltage source 405, voltage source 410, equalization switches 420-a and 420-b, isolation components 425-a and 425-b, boost component 430, capacitor 435, selection component 440, capacitor plate line 445, and capacitor word line 450. Equalization switches 420, isolation components 425, and selection component 440 may also be generally referred to as switching components.

Digit line 115-b and reference line 225-a may have intrinsic capacitances 415-a and 415-b, respectively. Intrinsic capacitances 415-a and 415-b may not be electrical devices—i.e., may not be two-terminal capacitors. Instead, intrinsic capacitances 415-a and 415-b may depend on physical characteristics, including the dimensions, of digit line 115-b and reference line 225-a. In some cases, reference line 225-a is an unused or inactive digit line. In some examples, digit line 115-b and reference line 225-a may be connected to or separated from virtual ground through equalization switches 420-a and 420-b. A virtual ground may act as a common reference for circuit 400 and may also be referred to as ground or 0V, although, the virtual ground may float to a voltage that is different than (e.g., greater or less than) zero volts when compared with an earth ground. In one example, control signals (e.g., a linear equalization signal) may be used to activate or deactivate equalization switches 420-a or 420-b by increasing or decreasing a linear equalization voltage applied to the switching component, respectively. In some cases, equalization switch 420-a may be used to prevent the voltage of digit line 115-b from floating while digit line 115-b is not being used. Equalization switches 420-a and 420-b may be implemented as transistors (e.g., a field effect transistors (FETs)).

A voltage may be applied to reference line 225-a to provide a reference for comparing with the voltage of digit line 115-b. The voltage of reference line 225-a may be used by sense component 125-b as a reference for comparison against the voltage of digit line 115-b. As depicted, ferroelectric memory cell 105-b is in electronic communication with digit line 115-b. Ferroelectric memory cell 105-b may include a selection component in electronic communication with a ferroelectric capacitor via word line 110-b, as described with reference to FIG. 2. The selection component may be activated by applying a voltage to word line 110-b and may be used to provide a conductive path between the ferroelectric capacitor and the digit line 115-b. In one example, ferroelectric memory cell 105-b may be selected, using the selection component, for a read operation to determine a state stored by the ferroelectric capacitor.

Plate line 210-a may also be in electronic communication with the ferroelectric capacitor. In some cases, a plate of the ferroelectric capacitor may be biased via plate line 210-a (e.g., for a read operation). Applying a non-zero voltage across the capacitor in combination with applying a voltage to word line 110-b may result in the ferroelectric capacitor charging digit line 115-b. That is, upon accessing ferroelectric memory cell 105-b, the ferroelectric capacitor may share charge with digit line 115-b via intrinsic capacitance 415-a. For moving cell plate operation or architecture, the digit line 115-b may be driven to a ground reference and a voltage is applied at plate line 210-a to apply a voltage across the ferroelectric capacitor, where the voltage applied to plate line 210-a may be ramped from a first to a second voltage. For fixed cell plate operation or architecture, a constant voltage may be applied to plate line 210-a and the voltage of digit line 115-b may be driven to a virtual ground to apply a voltage across the ferroelectric capacitor.

Isolation component 425-a may be in electronic communication with sense component 125-b and digit line 115-b, and isolation component 425-b may be in electronic communication with sense component 125-b and reference line 225-a. Isolation components 425-a and 425-b may be used to isolate digit line 115-b and reference line 225-a from sense component 125-b. Sense component 125-b may be used to determine the stored state of ferroelectric memory cell 105-b. In some cases, sense component 125-b is or includes a sense amplifier. Sense component 125-b may be operated by voltage source 405 and voltage source 410. In some examples, voltage source 405 is a positive supply voltage, while voltage source 410 is a negative supply voltage or a virtual ground. Sense component 125-b may be activated or deactivated by a controller.

Sense component 125-b may be used to determine a logic value of the ferroelectric memory cell 105-b based at least in part on the voltage of digit line 115-b and the voltage of the reference line 225-a. In some examples, sense component 125-b is activated or "fired" to trigger a comparison between the voltage of digit line 115-b and the voltage of reference line 225-a. Sense component 125-b may latch the output of a sense amplifier to the voltage provided by either voltage source 405 or voltage source 410. For instance, if the voltage of the digit line 115-b is greater than the voltage of the reference line 225-a, then sense component 125-b may latch the output of the sense amplifier at a positive voltage supplied from voltage source 405. In some examples, sense component 125-b may be used to apply a voltage to digit line 115-b and reference line 225-a. For instance, during a write operation sense component 125-b may be triggered to apply a voltage that is greater than a voltage applied at plate line 210-a to write a logic state "1." In some examples, the voltage applied by sense component 125-b may be dependent on voltage source 405 and 410. For instance, voltage source 405 may provide the voltage that is greater than the voltage applied at plate line 210-a.

Boost component 430 may be a circuit that is used to transfer charge to digit line 115-b during a write operation. In the example of FIG. 4, boost component 430 may be implemented with an energy storage component, capacitor 435, and a switching component, selection component 440. Capacitor 435 may be implemented as a dielectric capacitor or as one or more ferroelectric capacitors. Capacitor 435 may include a first plate ("top plate") and a second plate ("bottom plate"). In one example, a voltage may be applied to the top plate by applying a voltage to capacitor plate line 445 and a voltage may be applied to the bottom plate by activating selection component 440 and biasing the voltage of digit line 115-b. Selection component 440 may be in electronic communication with capacitor 435 and digit line 115-b, and activating selection component 440 may establish a conductive path between capacitor 435 and digit line 115-b.

In some examples, boost component 430 is implemented by an additional or unused memory cell. Capacitor word line 450 may be used to activate/deactivate selection component 440. In some cases, a voltage may be applied to capacitor word line 450 to activate selection component 440 and removed to deactivate selection component 440.

However, in some examples, the voltage may be applied to deactivate selection component 440 and removed to activate selection component 440, depending on the type of switching component (e.g., p-type FET or n-type FET) used to implement selection component 440. Capacitor plate line 445 may be used to apply a voltage to capacitor 435 and may be used to store or remove charge to/from capacitor 435. In some cases, a voltage applied to capacitor 435 via capacitor plate line 445 may be positively or negatively ramped to transfer charge to/from capacitor 435.

In some examples, a controller may be used to operate circuit 400 to support boosting of the voltage of digit line 115-b during a write operation. For instance, the controller may be used to trigger sense amplifier to perform a sensing operation or to apply a voltage to digit line 115-b and/or reference line 225-a. The controller may also be used to activate/deactivate equalization switches 420, isolation components 425, and selection component 440 and to select memory cell 105-b via word line 110-b. In some examples, the controller may be used to trigger boost component 430 to transfer charge to/from digit line 115-b. For instance, by applying a voltage to capacitor word line 450 and by applying or removing a voltage to or from capacitor plate line 445.

Figure 5:
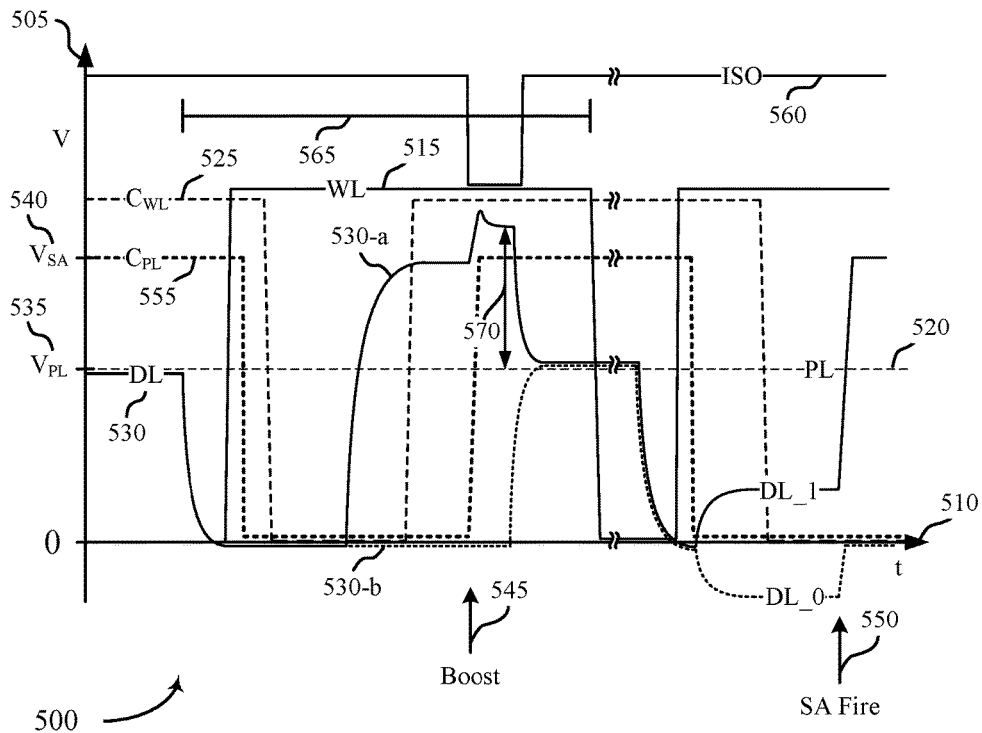
FIG. 5 illustrates a timing diagram for a write operation with a boosted digit line voltage in accordance with various embodiments of the present disclosure.

FIG. 5 illustrates a timing diagram 500 for a ferroelectric memory cell sensing scheme with mitigated margin loss in accordance with various embodiments of the present disclosure. Timing diagram 500 depicts voltage on axis 505 and time on axis 510. The voltage of various components as a function of time may thus be represented on timing diagram 500. For example, timing diagram 500 includes word line voltage 515, plate line voltage 520, capacitor word line voltage 525, digit line voltages 530-a and 530-b, capacitor plate voltage 555 and isolation voltage 560. Timing diagram 500 may also include plate voltage 535, sense component supply voltage 540, boosting time 545, firing time 550 and write duration 565. Timing diagram 500 depicts an example operation of circuit 400 described with reference to FIG. 4. FIG. 5 is described below with reference to components of preceding figures. Voltages that approach zero may be offset from axis 510 for ease of representation; in some cases, these voltages may be equal to or approximately equal to zero.

As discussed with reference to FIG. 4, digit line voltage 530 may initially be applied to digit line 115-b and may be at or near plate voltage 535. In some cases, plate line voltage 520 may be constantly applied to plate line 210-a throughout memory operations. Capacitor plate voltage 555 may be initially applied to capacitor plate line 445 and may be at or near a sense component supply voltage 540, which may be the voltage supplied by voltage source 405. Capacitor word line voltage 525 may be initially applied to capacitor word line 450 establishing a conductive path between capacitor 435 and digit line 115-b. Therefore, a negative voltage may be applied across capacitor 435—i.e., measured from the bottom plate to the top plate—and capacitor 435 may be negatively polarized. Additionally, isolation voltage 560 may be applied to isolation components 425-a, establishing a conductive path between the inputs of sense component 125-b, digit line 115-b, and reference line 225-a.

Subsequently, digit line voltage 530 may be driven to a virtual ground in preparation for a write operation, for instance, by activating equalization switch 420-a.

Virtually ground digit line voltage 530 may mark the beginning of write duration 565. Memory cell 105-b may then be accessed by applying word line voltage 515 to word line 110-b and a conductive path between a ferroelectric capacitor of memory cell 105-b and digit line 115-b may be established. Accordingly, charge stored in the ferroelectric capacitor may be released to digit line 115-b. In the example of FIG. 4, no charge may be initially stored by memory cell 105-b. Capacitor plate voltage 555 may be removed after selecting memory cell 105-b and the voltage across capacitor 435, as measured above may be decreased, pulling charge from digit line 115-b to capacitor 435 and depolarizing capacitor 435. In some cases, depolarizing capacitor 435 drives digit line voltage 530 below virtual ground, however, by maintaining equalization switch 420-a in an activated state the digit line voltage 530 may be driven back to virtual ground. Capacitor word line voltage 525 may then be removed to deactivate selection component 440 and isolate capacitor 435 from digit line 115-b.

After digit line voltage 530 has returned to virtual ground sense component 125-b may be used to apply a voltage to digit line 115-b for the write operation. Depending on which logic state is to be written, sense component 125-b may apply a high digit line voltage 530-a or a low digit line voltage 530-b. Applying the high digit line voltage 530-a may result in a negative voltage being applied across the ferroelectric capacitor of memory cell 105-a and may be used to store a logic "1" state, as discussed with reference to FIG. 3. Similarly applying the low digit line voltage 530-b may result in a positive voltage across the ferroelectric capacitor and may be used to store a logic "0" state. In some cases, applying the digit line voltage 530-a or 530-b may include "over driving" sense component 125-b to provide the supply voltages at the inputs of sense component 125-b. Over driving sense component 125-b may include applying a voltage to an output of sense component 125-b that results in a change at the inputs of sense component 125-b.

After applying the digit line voltage 530-a or 530-b, selection component 440 may be reactivated. In some examples, selection component 440 may be reactivated after determining that digit line voltage 530-a or 530-b has reached a threshold associated with applying the digit line voltages 530, and a positive voltage may be applied across capacitor 435, as measured above. In some cases, the threshold may be associated with a magnitude of the digit line voltage 530-a or may be a duration determined based on a timing associated with reading or writing memory cell 105-b. At boosting time 545, isolation voltage 560 may be decreased and digit line 115-b may be isolated from sense component 125-b. Concurrently, capacitor plate voltage 555 may be increased—i.e., ramped from a low to high voltage. The voltage applied across capacitor 435 may decreased as capacitor plate voltage 555 is ramped and capacitor 435 may transfer charge to digit line 115-b, boosting digit line voltage 530-a above the sense component supply voltage 540.

Therefore, a larger voltage magnitude 570 may be applied across the ferroelectric capacitor of memory cell 105-*b* and a larger amount of charge may be stored for logic state "1." Storing additional charge for logic state "1" may increase a sensing window in a subsequent read operation. Digit line voltage 530-*b* may also be increased when capacitor plate voltage 555 is increased, however, a temporary decrease in the voltage applied across the ferroelectric capacitor may not affect the amount of charge stored for logic state "0."

After a duration associated with digit line voltage 530-*a* or 530-*b* settling has passed, a conductive path between digit line 115-*b* and sense component 125-*b* may be re-established by increasing isolation voltage 560, and digit line voltage 530-*a* or 530-*b* may be driven to or near plate voltage 535. In some cases, to drive digit line voltage 530-*a* or 530-*b* to plate voltage 535, digit line 115-*b* may be temporarily connected to plate line 210-*a* via a switching component. In other cases, after writing a logic state to memory cell 105-*b*, the voltage of digit line 115-*b* may be high while the voltage of reference line 225-*a* may be low, or vice versa. Reference line 225-*a* and digit line 115-*b* may then be shorted together to create an intermediary voltage that is at or near plate voltage 535. After returning digit line voltage 530-*a* or 530-*b* to plate voltage 535, capacitor 435 may again be in a polarized state, and memory cell 105-*b* may be de-selected by decreasing word line voltage 515. De-selecting memory cell 105-*b* may mark the end of write duration 565.

At a later point in time, digit line voltage 530-*a* or 530-*b* may be virtually grounded in preparation for a read operation. After digit line voltage 530-*a* or 530-*b* has reached virtual ground, capacitor plate voltage 555 may be decreased, transferring charge from digit line 115-*b* to capacitor 435. Transferring charge from digit line 115-*b* to capacitor 435 may maintain digit line voltage 530-*a* or 530-*b* at or near ground, increasing the voltage applied across the ferroelectric capacitor of memory cell 105-*b*. And increasing the voltage applied across the ferroelectric capacitor may increase the amount of charge released from the ferroelectric capacitor to digit line 115-*b*. Furthermore, as a result of the prior write operation, additional charge may be stored by the ferroelectric capacitor prior to the read operation. Therefore, the sensing window—e.g., the difference between the resulting digit line voltages 530-*a* and 530-*b*—may be increased for a subsequent sensing operation.

At firing time 550, sense component 125-*b* may be activated or "triggered." The sense component 125-*b* may compare the digit line voltage 530-*a* or 530-*b*, depending on which logic state was stored during the previous write operation, with a reference voltage and the output of the sense component 125-*b* may be latched, accordingly. For instance, if a logic value "1" is stored by the ferroelectric capacitor, then the sense component 125-*b* may compare digit line voltage 530-*a* with a reference voltage and may determine the digit line voltage 530-*a* is higher than the reference voltage. Therefore, the output of the sense component 125-*b* may be driven to a positive supply voltage and latched. In the example depicted in FIG. 5, when the sense component 125-*b* outputs the positive supply voltage, digit line 115-*b* is also driven to the supply voltage. Although the above discussion is in the context of a sensing scheme that uses a fixed plate voltage, a moving plate scheme may similarly boost the voltage of digit line 115-*b* during a write operation as discussed herein.

Figure 6:
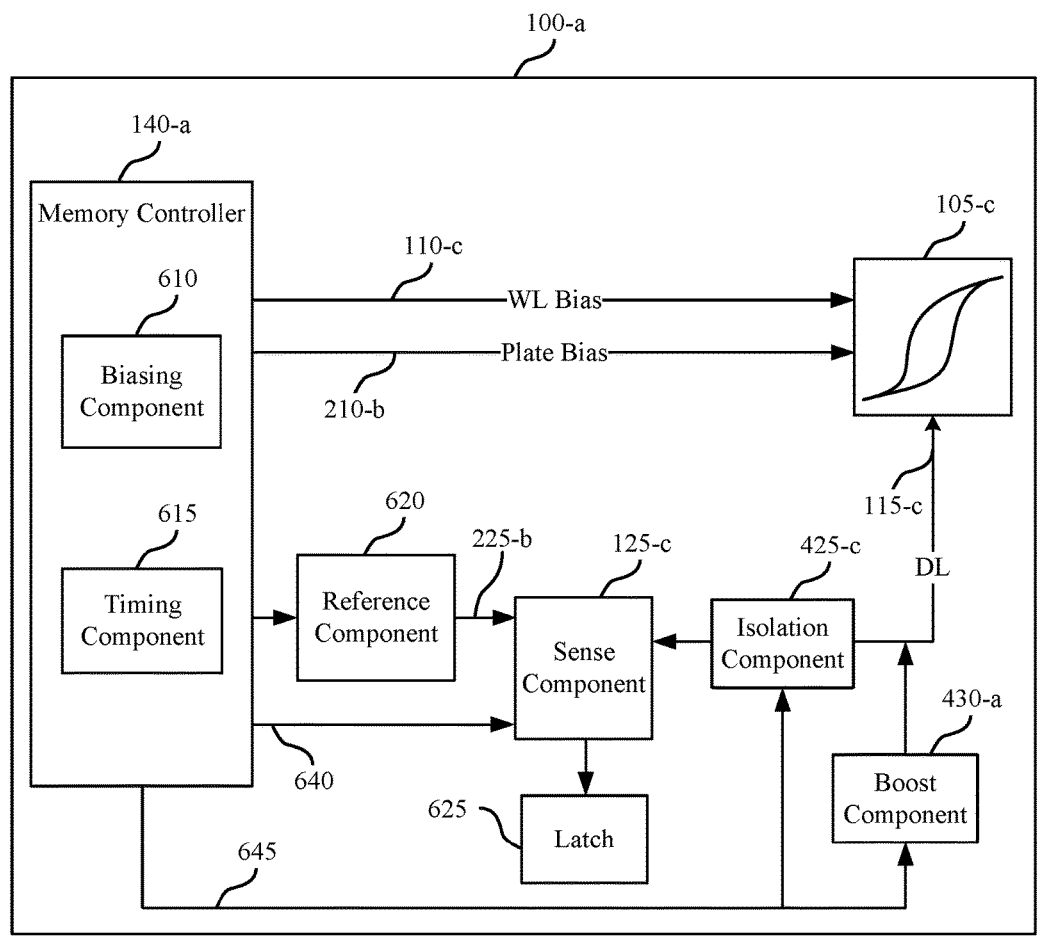
FIG. 6 illustrates a block diagram of an example ferroelectric memory array that supports a write operation with a boosted digit line voltage in accordance with various embodiments of the present disclosure.

FIG. 6 shows a block diagram 600 of a memory array 100-*a* that supports a write operation with a boosted digit line voltage in accordance with various embodiments of the present disclosure. Memory array 100-*a* may be referred to as an electronic memory apparatus and includes memory controller 140-*a*, memory cell 105-*c*, isolation component 425-*c* and boost component 430-*a*, which may be examples of memory controller 140, memory cell 105, isolation components 425, and boost component 430 as described with reference to FIGS. 1, 2, and 4. Memory controller 140-*a* may include biasing component 610 and timing component 615 and may operate memory array 100-*a* as described in FIGS. 1-5.

Memory controller 140-*a* may be in electronic communication with word line 110-*c*, digit line 115-*c*, sense component 125-*c*, and plate line 210-*b*, which may be examples of word line 110, digit line 115, sense component 125, and plate line 210 described with reference to FIG. 1 or 2. Memory array 100-*a* may also include reference component 620 and latch 625. The components of memory array 100-*a* may be in electronic communication with each other and may perform the functions described with reference to FIGS. 1-5. In some cases, reference component 620, sense component 125-*c*, and latch 625 may be components of memory controller 140-*a*.

In some examples, digit line 115-*c* is in electronic communication with equalization switch 420-*a*, sense component 125-*c*, and a ferroelectric capacitor of ferroelectric memory cell 105-*c*. Word line 110-*c* may be in electronic communication with memory controller 140-*a* and a selection component of memory cell 105-*c*. Plate line 210-*a* may be in electronic communication with memory controller 140-*a* and a plate of a ferroelectric capacitor of ferroelectric memory cell 105-*c*. Sense component 125-*c* may be in electronic communication with memory controller 140-*a*, reference line 225-*b*, digit line 115-*c*, and latch 625.

Reference component 620 may be in electronic communication with memory controller 140-*a* and reference line 225-*b*. Sense control line 640 may be in electronic communication with sense component and memory controller 140-*a*. Boost component 430-*a* may be in electronic communication with memory controller 140-*a* and digit line 115-*c*. Boost control line 645 may be in electronic communication with memory controller 140-*a*, boost component 430-*a*, and isolation component 425-*c*. Isolation component 425-*c* may be in electronic communication with digit line 115-*c*, sense component 125-*c*, and memory controller 140-*a*. These components may also be in electronic communication with other components, both inside and outside of memory array 100-*a*, not listed above, via other components, connections, or busses.

Memory controller 140-*a* may be configured to activate word line 110-*c*, plate line 210-*b*, or digit line 115-*c* by applying voltages to those various nodes. For example, biasing component 610 may be configured to apply a voltage to operate memory cell 105-*c* to read or write memory cell 105-*c* as described above. In some cases, memory controller 140-*a* may include a row decoder, column decoder, or both, as described with reference to FIG. 1. This may enable memory controller 140-*a* to access one or more memory cells 105. Biasing component 610 may also provide voltage potentials to reference component 620 in order to generate a reference signal for sense component 125-*c*. Additionally, biasing component 610 may provide voltage potentials for the operation of sense component 125-*c*.

In some cases, memory controller 140-*a* may perform its operations using timing component 615. For example, timing component 615 may control the timing of the various word line selections or plate biasing, including timing for switching and voltage application to perform the memory functions, such as reading and writing, discussed herein. In some cases, timing component 615 may control the operations of biasing component 610. Reference component 620 may include various components to generate a reference signal for sense component 125-c. Reference component 620 may include circuitry configured to produce a reference signal. In some cases, reference component 620 may be implemented using other ferroelectric memory cells 105. Sense component 125-c may compare a signal from memory cell 105-c (through digit line 115-c) with a reference signal from reference component 620. Upon determining the logic state, the sense component may then store the output in latch 625, where it may be used in accordance with the operations of an electronic device that memory array 100-a is a part.

Boost component 430-a may be used to increase the voltage of digit line 115-c during a write cycle. In some cases, memory controller 140-a may operate boost component 430-a via boost control line 645. Boost component 430-a may include an energy storage component, such as a capacitor, and a selection component, such as a switching transistor. In some cases, boost component 430-a may be triggered to transfer charge onto digit line 115-c from the energy storage component.

Isolation component 425-c may be used to isolate digit line 115-c from sense component 125-c, which in some cases facilitates boosting digit line 115-c. Isolation component 425-c may similarly be operated via memory controller 140-a using boost control line 645. In some cases, boost control line 645 includes multiple control lines and is used to independently operate isolation component 425-c and boost component 430-a.

In some examples, memory controller 140-a may be operated to control the components of memory array 100-a to boost a voltage of digit line 115-c during a write operation. In some cases, memory controller 140-a may determine that a threshold associated with applying the first voltage a voltage of digit line 115-c has been reached, which may trigger biasing component 610 to activate a switching component (e.g., selection component 440) of boost component 430-a based on the determination that the threshold has been reached. Memory controller 140-a may also use timing component 615 to trigger biasing component 610 to apply the second voltage to a first plate of the additional capacitor of boost component 430-a after activating the switching component. In some cases, memory controller 140-a may use timing component 615 and biasing component 610 to virtually ground digit line 115-c before selecting the memory cell. In some cases, a second plate of the additional capacitor is in electronic communication with digit line 115-c via the switching component, and memory controller 140-a may virtually ground the first plate of the additional capacitor after selecting the memory cell.

Memory controller 140-a may also use timing component 615 and biasing component 610 to deactivate the switching component after virtually grounding the first plate of the additional capacitor. In some cases, memory controller 140-a may use biasing component 610 to apply a constant voltage to plate line 210-b; and may use biasing component 610 and timing component 615 to apply a third voltage to digit line 115-c after the write operation, wherein a magnitude of the third voltage is equal to a magnitude of the constant voltage. In yet other examples, memory controller 140-a may use biasing component 610 and timing component 615 to isolate digit line 115-c (e.g., via isolation component 425-c) from sense component 125-c after activating the switching component and before applying the second voltage.

Figure 7:
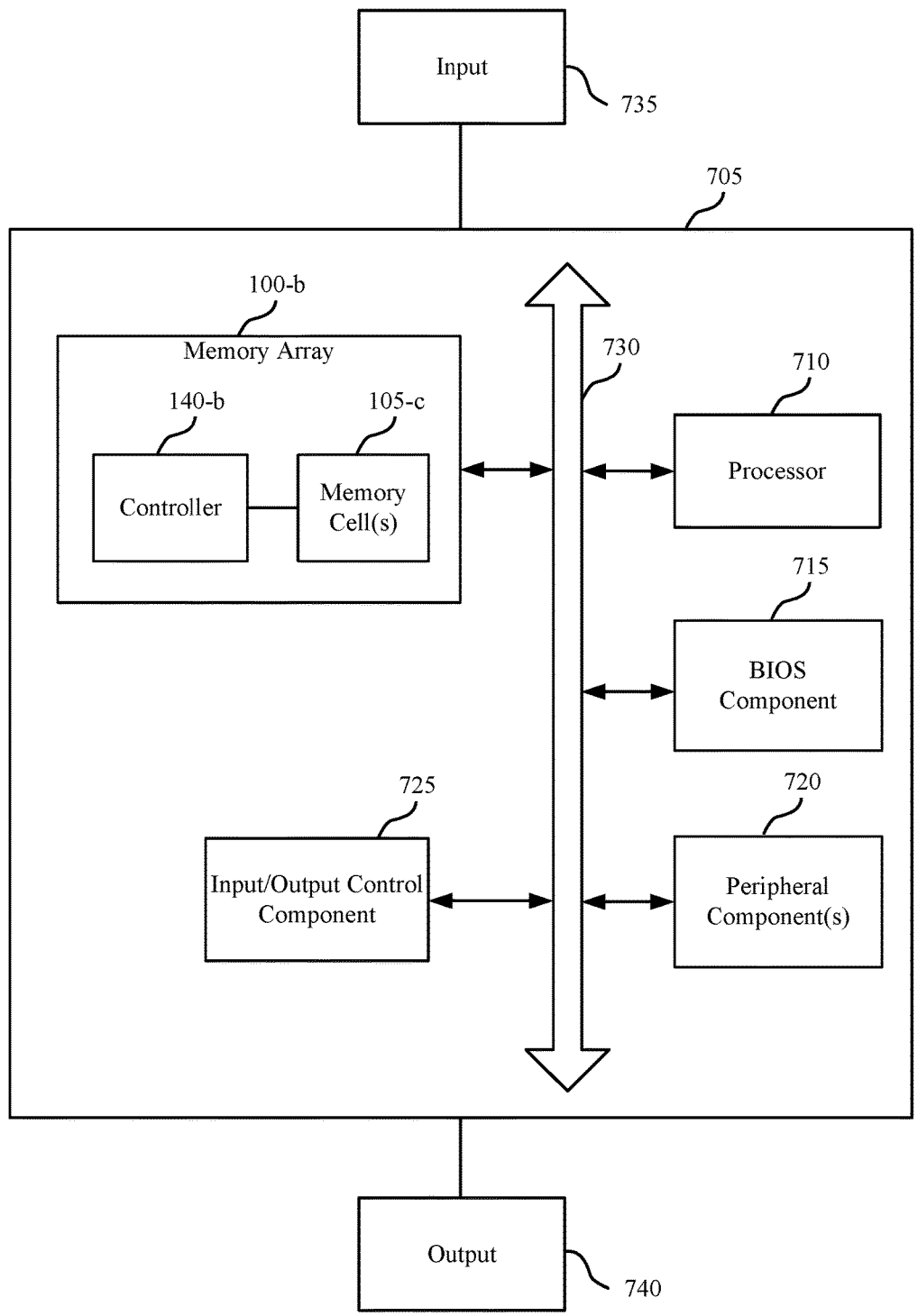
FIG. 7 illustrates a system, including a memory array, that supports a write operation with a boosted digit line voltage in accordance with various embodiments of the present disclosure.

FIG. 7 illustrates a system 700 that supports a write operation with a boosted digit line voltage in accordance with various embodiments of the present disclosure. System 700 includes a device 705, which may be or include a printed circuit board to connect or physically support various components. Device 705 includes a memory array 100-b, which may be an example of memory array 100 described with reference to FIG. 1 and FIG. 6. Memory array 100-b may contain memory controller 140-b and memory cell(s) 105-c, which may be examples of memory controller 140 described with reference to FIGS. 1 and 6 and memory cells 105 described with reference to FIGS. 1, 2, 4, and 6. Device 705 may also include a processor 710, BIOS component 715, peripheral component(s) 720, and input/output control component 725. The components of device 705 may be in electronic communication with one another through bus 730.

Processor 710 may be configured to operate memory array 100-a through memory controller 140-b. In some cases, processor 710 may perform the functions of memory controller 140 described with reference to FIGS. 1 and 6. In other cases, memory controller 140-b may be integrated into processor 710. Processor 710 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 710 may perform various functions described herein, including a write operation with a boosted digit line voltage. Processor 710 may, for example, be configured to execute computer-readable instructions stored in memory array 100-a to cause device 705 perform various functions or tasks.

BIOS component 715 may be a software component that includes a basic input/output system (BIOS) operated as firmware, which may initialize and run various hardware components of system 700. BIOS component 715 may also manage data flow between processor 710 and the various components, e.g., peripheral components 720, input/output control component 725, etc. BIOS component 715 may include a program or software stored in read-only memory (ROM), flash memory, or any other non-volatile memory.

Peripheral component(s) 720 may be any input or output device, or an interface for such devices, that is integrated into device 705. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 725 may manage data communication between processor 710 and peripheral component(s) 720, input devices 735, or output devices 740. Input/output control component 725 may also manage peripherals not integrated into device 705. In some cases, input/output control component 725 may represent a physical connection or port to the external peripheral.

Input 735 may represent a device or signal external to device 705 that provides input to device 705 or its components. This may include a user interface or interface with or between other devices. In some cases, input 735 may be a peripheral that interfaces with device 705 via peripheral component(s) 720 or may be managed by input/output control component 725.

Output 740 may represent a device or signal external to device 705 configured to receive output from device 705 or any of its components. Examples of output 740 may include a display, audio speakers, a printing device, another processor or printed circuit board, etc. In some cases, output 740 may be a peripheral that interfaces with device 705 via peripheral component(s) 720 or may be managed by input/output control component 725.

The components of memory controller 140-*b*, device 705, and memory array 100-*b* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 8:
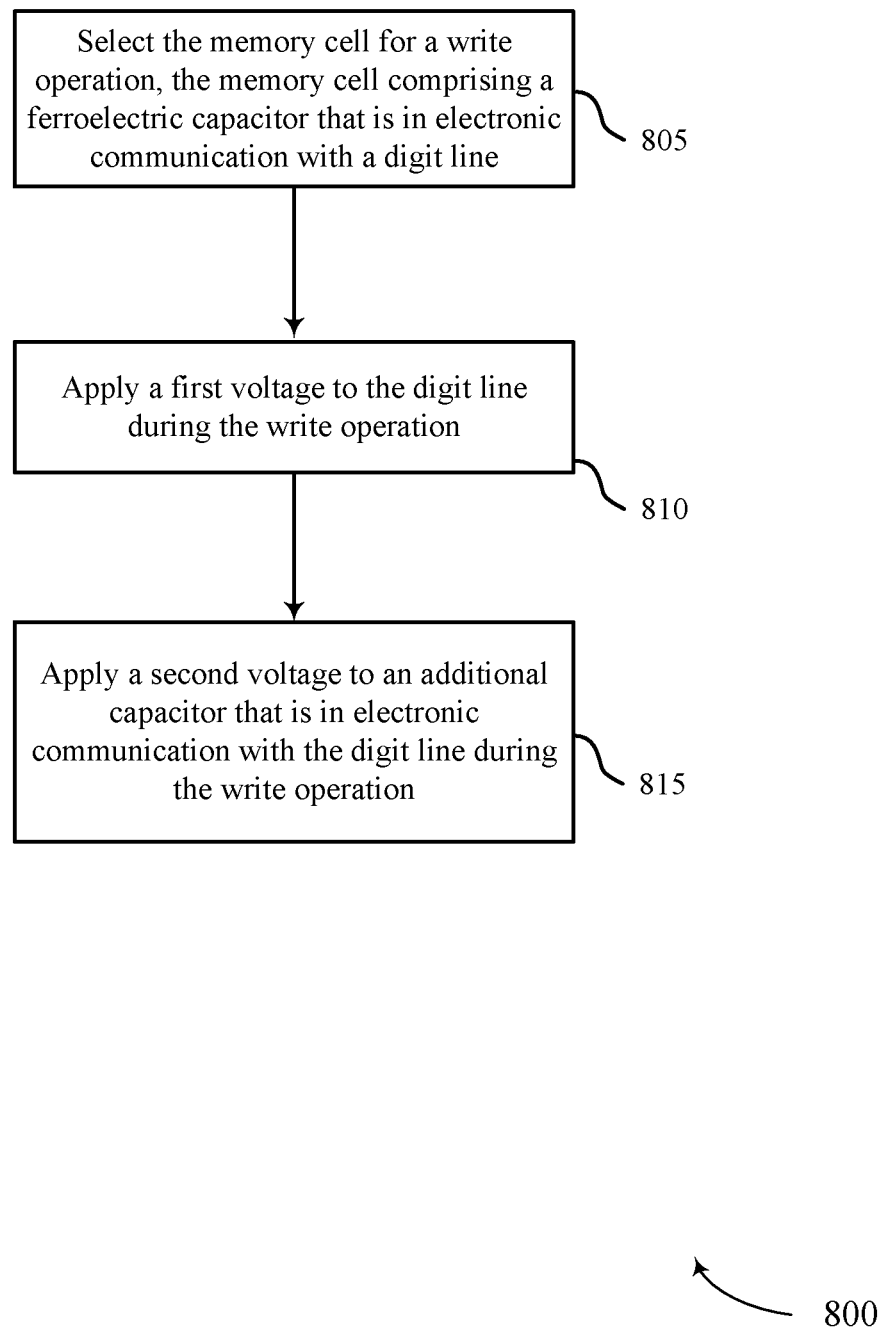
FIGS. 8-9 are flowcharts that illustrate a method or methods for a write operation with a boosted digit line voltage in accordance with various embodiments of the present disclosure.

FIG. 8 shows a flowchart illustrating a method 800 for a write operation with a boosted digit line voltage in accordance with various embodiments of the present disclosure. The operations of method 800 may be implemented by a memory array 100, as described with reference to FIGS. 1-6. For example, the operations of method 800 may be performed by a memory controller 140 as described with reference to FIGS. 1,6, and 7. In some examples, a memory controller 140 may execute a set of codes to control the functional elements of the memory array 100 to perform the functions described below. Additionally or alternatively, the memory controller 140 may perform features the functions described below using special-purpose hardware.

At block 805, the method may include selecting the memory cell for a write operation, the memory cell comprising a ferroelectric capacitor that is in electronic communication with a digit line, as described with reference to FIGS. 1-5. In certain examples, the operations of block 805 may be performed or facilitated by the biasing component 610 as described with reference to FIG. 6. In some examples, the method may include virtually grounding the digit line before selecting the memory cell for the write operation. In some examples, a second plate of an additional capacitor is in electronic communication with the digit line via the switching component, and a first plate of the additional capacitor is virtually grounded after selecting the memory cell for the write operation. In some examples, the switching component may be deactivated after virtually grounding the first plate of the additional capacitor.

At block 810, the method may include applying a first voltage to the digit line during the write operation, as described with reference to FIGS. 1-5. In certain examples, the operations of block 810 may be performed or facilitated by the biasing component 610, as described with reference to FIG. 6. In some examples of the method a sense component that is in electronic communication with the digit line may be triggered to apply the first voltage to the digit line.

At block 815, the method may include applying a second voltage to the additional capacitor that is in electronic communication with the digit line during the write operation, as described with reference to FIGS. 1-5. In certain examples, the operations of block 815 may be performed or facilitated by the biasing component 610, as described with reference to FIG. 6. In some cases, the second voltage may be applied to the first plate of the additional capacitor. In some cases, the additional capacitor may be a ferroelectric capacitor of a second memory cell that is in electronic communication with the digit line.

In some examples, the method may include activating a switching component that is in electronic communication with the additional capacitor and the digit line during the write operation. Activating the switching component may be based on determining that a voltage of the digit line has reached a threshold associated with applying the first voltage and applying the second voltage. In some cases, the second voltage may be applied to a first plate of the additional capacitor after the switching component is activated. In some examples, the digit line may be isolated after activating the switching component and prior to applying the second voltage. In some examples of the method, a constant voltage is applied at a plate line that is in electronic communication with the memory cell, and a third voltage is applied to the digit line after the write operation, wherein a magnitude of the third voltage is equal to the constant voltage. The digit line may be virtually grounded for a read operation after applying the third voltage.

Figure 9:
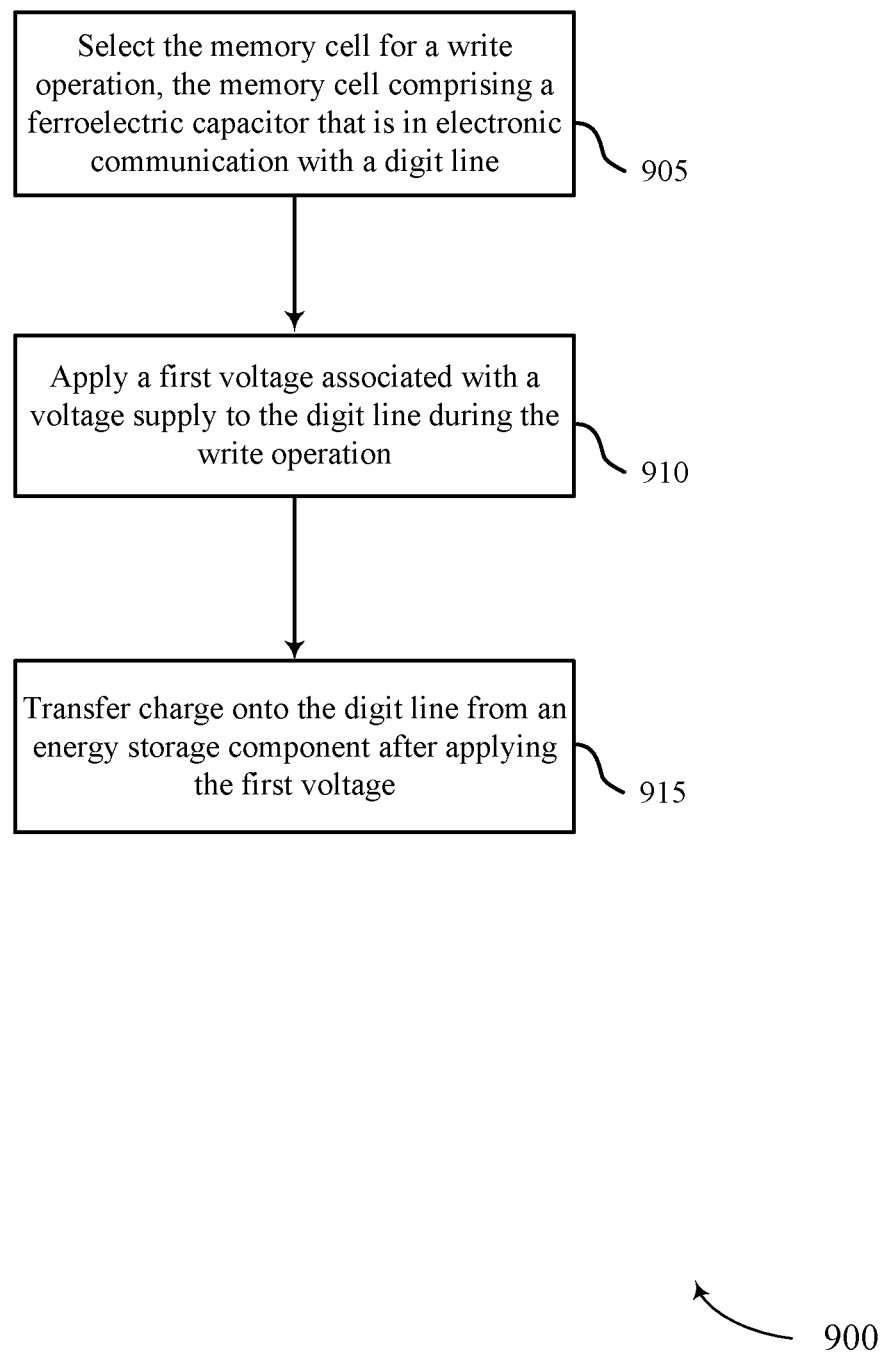

FIG. 9 shows a flowchart illustrating a method 900 for a write operation with a boosted digit line voltage in accordance with various embodiments of the present disclosure. The operations of method 900 may be implemented by a memory array 100, as described with reference to FIGS. 1-6. For example, the operations of method 900 may be performed by a memory controller 140 as described with reference to FIGS. 1, 6, and 7. In some examples, a memory controller 140 may execute a set of codes to control the functional elements of the memory array 100 to perform the functions described below. Additionally or alternatively, the memory controller 140 may perform features the functions described below using special-purpose hardware.

At block 905, the method may include selecting the memory cell for a write operation, the memory cell comprising a ferroelectric capacitor that is in electronic communication with a digit line, as described with reference to FIGS. 1-5. In certain examples, the operations of block 905 may be performed or facilitated by the biasing component 610, as described with reference to FIG. 6. In some cases, the memory cell is in electronic communication with a plate line, and a constant voltage is applied to the plate line.

At block 910, the method may include applying a first voltage associated with a voltage supply to the digit line during the write operation, as described with reference to FIGS. 1-5. In certain examples, the operations of block 915 may be performed or facilitated by the biasing component 610, as described with reference to FIG. 6. Applying the first voltage may include triggering a sensing component that is in electronic communication with the digit line and the voltage supply. In some examples, the method may include charging an energy storage component during the write operation.

At block 915, the method may include transferring charge onto the digit line from the energy storage component after applying the first voltage, as described with reference to FIGS. 1-5. In certain examples, the operations of block 915 may be performed or facilitated by the boost component 430, as described with reference to FIGS. 4 and 6. In some cases, the energy storage component may be in electronic communication with the digit line via a switching component, and the method may further include activating the switching component. In some examples of the method transferring the charge onto the digit line includes discharging the energy storage component onto the digit line.

Thus, methods 800 and 900 may provide a method or methods of operating a memory cell to support a write operation with a boosted digit line voltage. It should be noted that methods 800 and 900 describe possible implementations, and the operations and steps may be rearranged or otherwise modified such that other implementations are possible. In some examples, features from two or more of the methods 800 and 900 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently flowing between them; components are isolated from each other if there is an open circuit between them. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
selecting a memory cell comprising a first capacitor for a write operation;
applying a first voltage, during the write operation, to a digit line coupled with the memory cell; and
applying a second voltage to a second capacitor coupled with the memory cell during the write operation.

2. The method of claim 1, further comprising:
coupling the second capacitor with the digit line before selecting the memory cell.

3. The method of claim 2, further comprising:
determining that a voltage of the digit line satisfies a threshold associated with applying the first voltage, wherein coupling the second capacitor to the digit line is based at least in part on determining that the threshold is satisfied.

4. The method of claim 2, wherein the second voltage is applied to a plate of the second capacitor after the second capacitor is coupled with the digit line.

5. The method of claim 1, further comprising:
virtually grounding a plate of the second capacitor after selecting the memory cell for the write operation.

6. The method of claim 5, further comprising:
isolating the second capacitor from the digit line while the plate is virtually grounded.

7. The method of claim 1, further comprising:
applying a constant voltage to a plate line that is coupled with the memory cell; and
applying a third voltage to the digit line after the write operation, wherein a magnitude of the third voltage is equal to a magnitude of the constant voltage.

8. The method of claim 7, further comprising:
virtually grounding, during a read operation, the digit line after applying the third voltage.

9. The method of claim 1, further comprising:
isolating the digit line from a sense component before applying the second voltage.

10. The method of claim 9, wherein the digit line is isolated from the sense component after coupling the second capacitor to the digit line.

11. The method of claim 1, wherein a second memory cell comprises the second capacitor, the second memory cell coupled with the digit line.

12. The method of claim 1, wherein the first capacitor and the second capacitor are ferroelectric capacitors.

13. A method comprising:
selecting a memory cell comprising a first capacitor for a write operation;
applying a voltage to a digit line during the write operation; and
discharging a charge onto the digit line from an energy storage component after applying the voltage.

14. The method of claim 13, further comprising:
coupling the energy storage component with the digit line during the write operation.

15. The method of claim 14, further comprising:
determining that a voltage of the digit line satisfies a threshold associated with applying the voltage, wherein coupling the energy storage component to the digit line is based at least in part on determining that the threshold is satisfied.

16. The method of claim 13, further comprising:
charging the energy storage component during the write operation.

17. The method of claim 13, further comprising:
applying a voltage to a plate line coupled with the memory cell.

18. The method of claim 13, further comprising:
storing a logic state on the memory cell, wherein the logic state is based at least in part on applying the voltage and discharging the charge from the energy storage component.

19. The method of claim 13, further comprising:
isolating the digit line from a sense component before discharging the charge from the energy storage component.

20. An electronic memory apparatus, comprising:
a memory cell comprising a first capacitor;
a second capacitor; and
a controller coupled with the memory cell and the second capacitor, wherein the controller is operable to:
select the memory cell for a write operation;
apply a first voltage to a digit line during the write operation; and
apply a second voltage to the second capacitor during the write operation.

* * * * *